United States Patent
Ando

(10) Patent No.: US 11,355,257 B2
(45) Date of Patent: Jun. 7, 2022

(54) EXTREME ULTRAVIOLET LIGHT CONDENSATION MIRROR, EXTREME ULTRAVIOLET LIGHT CONDENSATION MIRROR MANUFACTURING METHOD, AND ELECTRONIC DEVICE MANUFACTURING METHOD

(71) Applicant: Gigaphoton Inc., Tochigi (JP)

(72) Inventor: Masahiko Ando, Oyama (JP)

(73) Assignee: Gigaphoton Inc., Tochigi (JP)

( * ) Notice: Subject to any disclaimer, the term of this patent is extended or adjusted under 35 U.S.C. 154(b) by 70 days.

(21) Appl. No.: 17/077,172

(22) Filed: Oct. 22, 2020

(65) Prior Publication Data
US 2021/0193344 A1   Jun. 24, 2021

(30) Foreign Application Priority Data

Dec. 20, 2019   (JP) .............................. JP2019-230665

(51) Int. Cl.
| | | |
|---|---|---|
| H05G 2/00 | (2006.01) | |
| G21K 1/06 | (2006.01) | |
| G02B 1/14 | (2015.01) | |
| G02B 5/08 | (2006.01) | |
| G02B 19/00 | (2006.01) | |
| G03F 7/20 | (2006.01) | |

(52) U.S. Cl.
CPC .............. *G21K 1/062* (2013.01); *G02B 1/14* (2015.01); *G02B 5/0816* (2013.01); *G02B 19/0047* (2013.01); *G02B 19/0095* (2013.01); *G03F 7/7015* (2013.01); *G03F 7/70033* (2013.01); *H05G 2/008* (2013.01)

(58) Field of Classification Search
CPC ..... G03F 7/70033; G03F 7/7015; G02B 1/14; G02B 5/0816; G02B 19/0095; G02B 19/0047
See application file for complete search history.

(56) References Cited

U.S. PATENT DOCUMENTS

| | | | |
|---|---|---|---|
| 9,618,846 B2 * | 4/2017 | Shamma | H01L 21/3146 |
| 9,773,578 B2 | 9/2017 | Kuznetsov et al. | |
| 2015/0311279 A1 | 10/2015 | Onozawa et al. | |
| 2020/0209759 A1 | 7/2020 | Wakabayashi et al. | |

FOREIGN PATENT DOCUMENTS

WO   2019/077734 A1   4/2019

OTHER PUBLICATIONS

A Search Report issued by the Netherlands Patent Office dated Apr. 26, 2021, which corresponds to Dutch Patent Application No. 2026727 and is related to U.S. Appl. No. 17/077,172; with partial English language explanation.

* cited by examiner

*Primary Examiner* — Hung V Nguyen
(74) *Attorney, Agent, or Firm* — Studebaker & Brackett PC

(57) ABSTRACT

An extreme ultraviolet light condensation mirror includes a substrate, and a multi-layer reflective film provided on the substrate, formed by alternately stacking an amorphous silicon layer and a layer having a refractive index different from a refractive index of the amorphous silicon layer, and configured to reflect extreme ultraviolet light, a layer on a most surface side in the multi-layer reflective film being the amorphous silicon layer containing a silicon atom bonded with a cyano radical.

16 Claims, 10 Drawing Sheets

Fig. 5

EXTREME ULTRAVIOLET LIGHT CONDENSATION MIRROR, EXTREME ULTRAVIOLET LIGHT CONDENSATION MIRROR MANUFACTURING METHOD, AND ELECTRONIC DEVICE MANUFACTURING METHOD

CROSS-REFERENCE TO RELATED APPLICATIONS

The present application claims the benefit of Japanese Patent Application No. 2019-230665, filed on Dec. 20, 2019, the entire contents of which are hereby incorporated by reference.

BACKGROUND

1. Technical Field

The present disclosure relates to an extreme ultraviolet light condensation mirror, an extreme ultraviolet light condensation mirror manufacturing method, and an electronic device manufacturing method.

2. Related Art

Recently, miniaturization of a transfer pattern in optical lithography of a semiconductor process has been rapidly proceeding along with miniaturization of the semiconductor process. Minute fabrication at 20 nm or smaller will be requested in the next generation technology. To meet the request for minute fabrication at 20 nm or smaller, it is desired to develop an exposure apparatus including a device configured to generate extreme ultraviolet (EUV) light at a wavelength of 13 nm approximately in combination with reduced projection reflective optics.

Disclosed EUV light generation devices include three kinds of devices of a laser produced plasma (LPP) device that uses plasma generated by irradiating a target material with a pulse laser beam, a discharge produced plasma (DPP) device that uses plasma generated by electrical discharge, and a synchrotron radiation (SR) device that uses synchrotron radiation.

LIST OF DOCUMENTS

Patent Documents

Patent Document 1: U.S. Pat. No. 9,773,578
Patent Document 2: US Published Patent Application No. 2015/0311279

SUMMARY

An extreme ultraviolet light condensation mirror according to an aspect of the present disclosure may include a substrate, and a multi-layer reflective film provided on the substrate, formed by alternately stacking an amorphous silicon layer and a layer having a refractive index different from a refractive index of the amorphous silicon layer, and configured to reflect extreme ultraviolet light, a layer on a most surface side in the multi-layer reflective film being the amorphous silicon layer containing a silicon atom bonded with a cyano radical.

An extreme ultraviolet light condensation mirror manufacturing method according to another aspect of the present disclosure may include a multi-layer reflective film formation process of forming, on a substrate, a multi-layer reflective film configured to reflect extreme ultraviolet light by alternately stacking an amorphous silicon layer and a layer having a refractive index different from a refractive index of the amorphous silicon layer so that a layer on a most surface side is the amorphous silicon layer, and a reaction process of bonding, with a cyano radical, each of at least some silicon atoms in the amorphous silicon layer on the most surface side in the multi-layer reflective film.

An electronic device manufacturing method according to another aspect of the present disclosure may include generating extreme ultraviolet light with an extreme ultraviolet light generation device including a chamber having an internal space in which a laser beam is condensed and plasma is generated from a target substance at a condensed position of the laser beam, and an extreme ultraviolet light condensation mirror configured to condense extreme ultraviolet light radiated through the plasma generation from the target substance, the extreme ultraviolet light condensation mirror including a substrate, and a multi-layer reflective film provided on the substrate, formed by alternately stacking an amorphous silicon layer and a layer having a refractive index different from a refractive index of the amorphous silicon layer, and configured to reflect extreme ultraviolet light, a layer on a most surface side in the multi-layer reflective film being the amorphous silicon layer containing a silicon atom bonded with a cyano radical; outputting the extreme ultraviolet light to an exposure apparatus; and exposing a photosensitive substrate to the extreme ultraviolet light in the exposure apparatus to manufacture an electronic device.

BRIEF DESCRIPTION OF THE DRAWINGS

Embodiments of the present disclosure will be described below as examples with reference to the accompanying drawings.

DESCRIPTION OF EMBODIMENTS

1. Overview
2. Description of electronic device manufacturing apparatus
3. Description of extreme ultraviolet light generation apparatus
   3.1 Configuration
   3.2 Operation
4. Description of extreme ultraviolet light condensation mirror of comparative example
   4.1 Configuration
   4.2 Problem
5. Description of extreme ultraviolet light condensation mirror of Embodiment 1
   5.1 Configuration
   5.2 Manufacturing method
   5.3 Effect
6. Description of extreme ultraviolet light condensation mirror of Embodiment 2
   6.1 Configuration
   6.2 Effect
7. Description of extreme ultraviolet light condensation mirror of Embodiment 3
   7.1 Configuration
   7.2 Effect Embodiments of the present disclosure will be described below in detail with reference to the accompanying drawings.

The embodiments described below are examples of the present disclosure, and do not limit the contents of the present disclosure. Not all configurations and operations described in each embodiment are necessarily essential as configurations and operations of the present disclosure. Components identical to each other are denoted by an identical reference sign, and duplicate description thereof will be omitted.

1. Overview

Embodiments of the present disclosure relate to an extreme ultraviolet light generation apparatus and an electronic device manufacturing apparatus configured to generate light having a wavelength corresponding to that of what is called extreme ultraviolet. In the present specification, extreme ultraviolet light is referred to as EUV light in some cases.

2. Description of Electronic Device Manufacturing Apparatus

Figure 1:
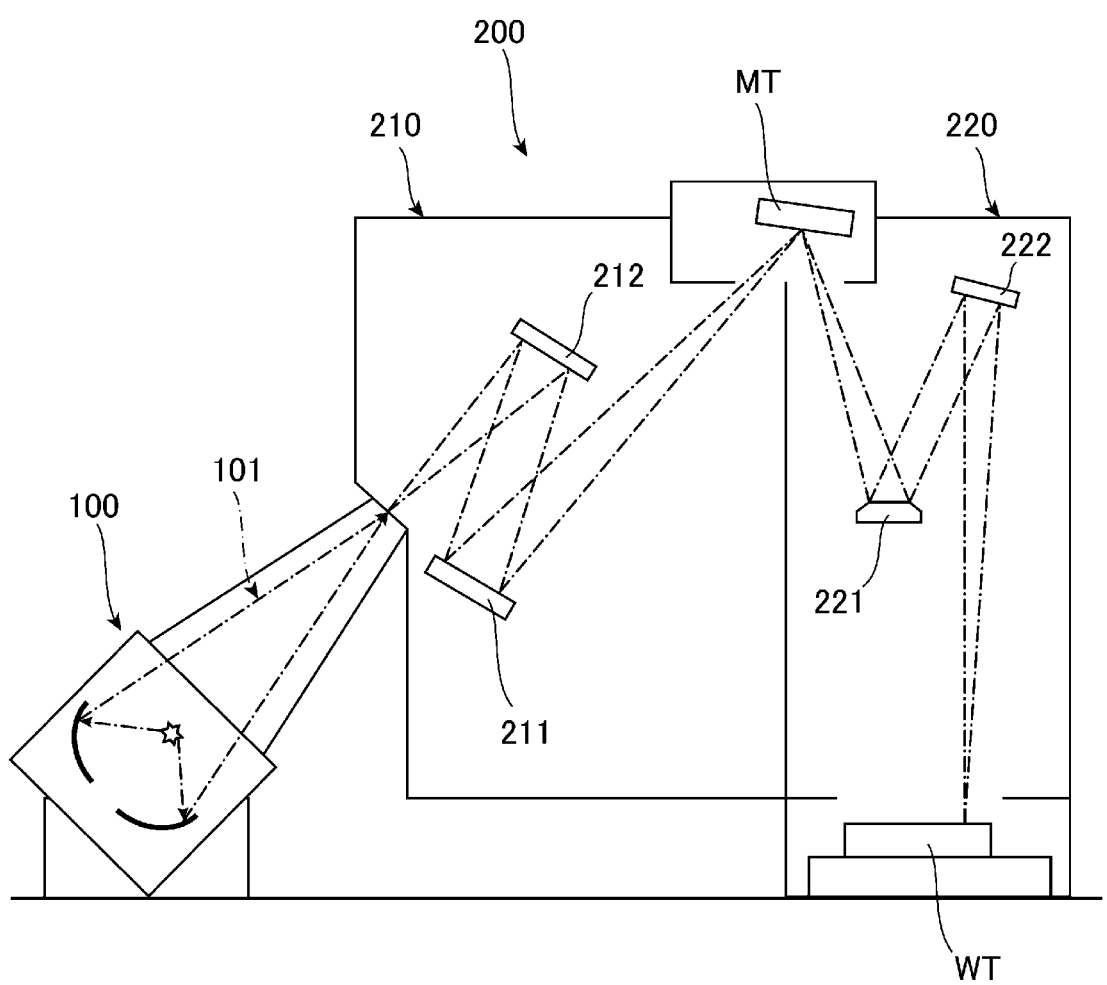
FIG. 1 is a pattern diagram illustrating an exemplary entire schematic configuration of an electronic device manufacturing device.

FIG. 1 is a pattern diagram illustrating an exemplary entire schematic configuration of the electronic device manufacturing device. As illustrated in FIG. 1, the electronic device manufacturing apparatus includes an EUV light generation apparatus 100 and an exposure apparatus 200. The exposure apparatus 200 includes a mask irradiation unit 210 including a plurality of mirrors 211 and 212, and a workpiece irradiation unit 220 including a plurality of mirrors 221 and 222. The mask irradiation unit 210 illuminates a mask pattern on a mask table MT through reflective optics with EUV light 101 incident from the EUV light generation apparatus 100. The workpiece irradiation unit 220 images the EUV light 101 reflected by the mask table MT onto a workpiece (not illustrated) disposed on the workpiece table WT through a reflection optical system. The workpiece is a photosensitive substrate such as a semiconductor wafer on which photoresist is applied. The exposure apparatus 200 translates the mask table MT and the workpiece table WT in synchronization to expose the workpiece to the EUV light 101 with the mask pattern reflected. Through an exposure process as described above, a device pattern is transferred onto the semiconductor wafer, thereby manufacturing a semiconductor device.

Figure 2:
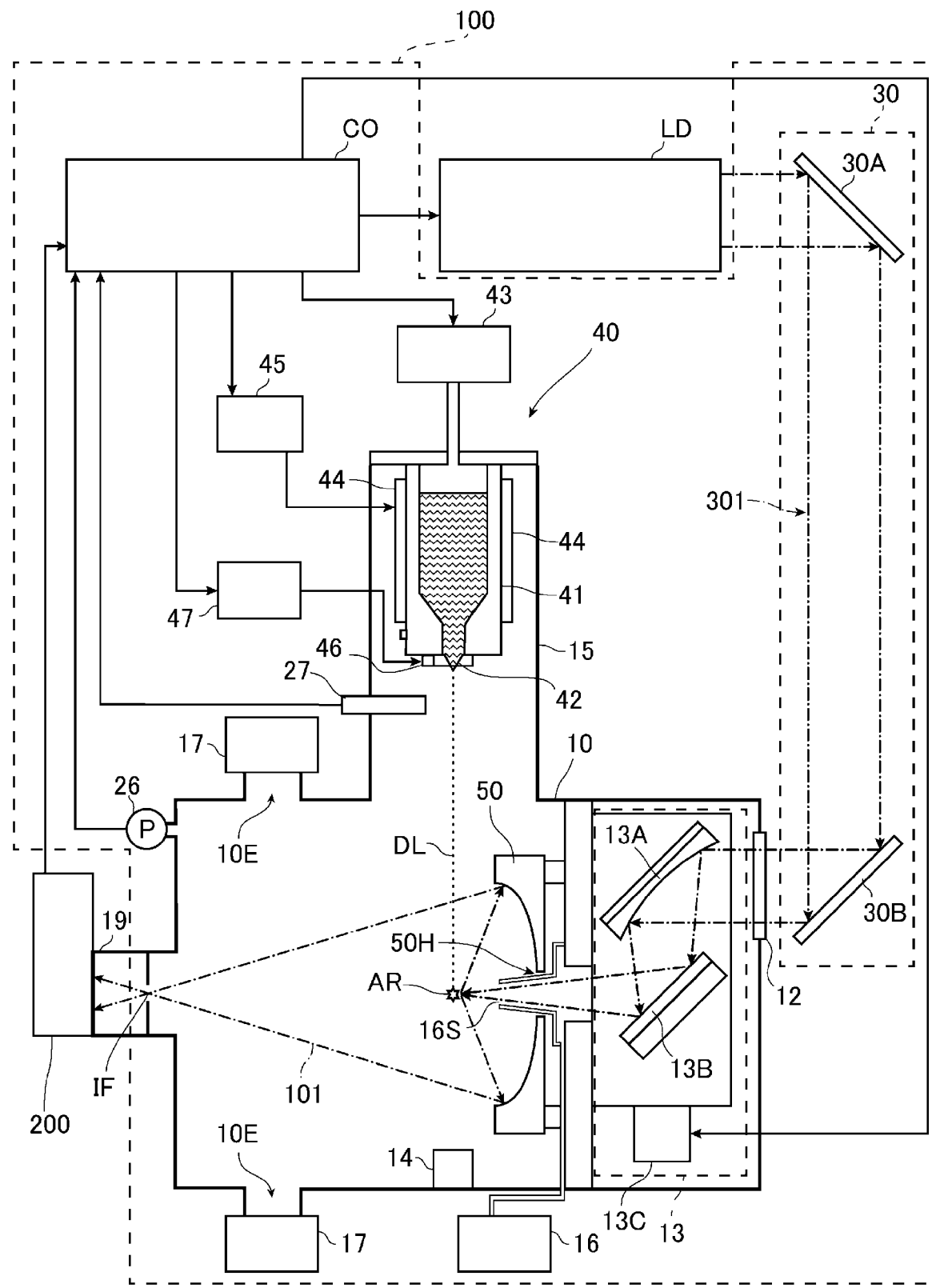
FIG. 2 is a pattern diagram illustrating an exemplary entire schematic configuration of an extreme ultraviolet light generation device.

3. Description of Extreme Ultraviolet Light Generation Apparatus 3.1 Configuration The following describes the extreme ultraviolet light generation device. FIG. 2 is a pattern diagram illustrating an exemplary entire schematic configuration of an extreme ultraviolet light generation device 100 of the present example. As illustrated in FIG. 2, the EUV light generation apparatus 100 of the present example is connected with a laser apparatus LD. The EUV light generation apparatus 100 of the present example includes a chamber device 10, a control unit CO, and a laser beam delivery optical system 30 as main components.

The chamber device 10 is a sealable container. The chamber device 10 includes a sub chamber 15 provided with a target supply unit 40. The target supply unit 40 includes a tank 41 and a nozzle 42. The target supply unit 40 supplies a droplet DL to the internal space of the chamber device 10 and is attached to, for example, penetrate through the wall of the sub chamber 15. The droplet DL, which is also called a target, is supplied from the target supply unit 40.

The tank 41 stores inside a target substance that becomes the droplet DL. The target substance contains tin. The inside of the tank 41 is communicated with, through a pipe, a pressure adjuster 43 configured to adjust gas pressure. In addition, a heater 44 is attached to the tank 41. The heater 44 heats the tank 41 by current supplied from a heater power source 45. Through the heating, the target substance in the tank 41 melts. The pressure adjuster 43 and the heater power source 45 are electrically connected with the control unit CO.

The nozzle 42 is attached to the tank 41 and discharges the target substance. A piezoelectric element 46 is attached to the nozzle 42. The piezoelectric element 46 is electrically connected with a piezoelectric power source 47 and driven by voltage applied from the piezoelectric power source 47. The piezoelectric power source 47 is electrically connected with the control unit CO. The target substance discharged from the nozzle 42 is formed into the droplet DL through operation of the piezoelectric element 46.

Further, the chamber device 10 includes a target collection unit 14. The target collection unit 14 collects any unnecessary droplet DL.

The wall of the chamber device 10 is provided with at least one through-hole. The through-hole is blocked by a window 12 through which a laser beam 301 emitted in pulses from the laser apparatus LD transmits.

Furthermore, a laser condensation optical system 13 is disposed in the chamber device 10. The laser condensation optical system 13 includes a laser beam condensation mirror 13A and a high reflectance mirror 13B. The laser beam condensation mirror 13A reflects and condenses the laser beam 301 transmitting through the window 12. The high reflectance mirror 13B reflects the light condensed by the laser beam condensation mirror 13A. The positions of the laser beam condensation mirror 13A and the high reflectance mirror 13B are adjusted by a laser beam manipulator 13C so that a laser focusing position in the chamber device 10 coincides with a position specified by the control unit CO.

An EUV light condensation mirror 50 having a reflective surface in a substantially spheroidal shape is disposed inside the chamber device 10. The EUV light condensation mirror 50 reflects EUV light and has a first focal point and a second focal point for the EUV light. The EUV light condensation mirror 50 is disposed so that, for example, the first focal point is positioned in a plasma generation region AR and the second focal point is positioned at an intermediate focus point IF. A through-hole 50H is provided at a central portion of the EUV light condensation mirror 50, and the laser beam 301 in pulses passes through the through-hole 50H.

The EUV light generation apparatus 100 further includes a connection unit 19 that provides communication between the internal space of the chamber device 10 and the internal space of the exposure apparatus 200. The connection unit 19 includes a wall through which an aperture is formed. The wall is preferably disposed so that the aperture is positioned at the second focal point of the EUV light condensation mirror 50.

The EUV light generation apparatus 100 further includes a pressure sensor 26. The pressure sensor 26 measures the pressure in the internal space of the chamber device 10. The EUV light generation apparatus 100 further includes a target sensor 27 attached to the chamber device 10. The target sensor 27 has, for example, an image capturing function and detects the existence, trajectory, position, speed, and the like of the droplet DL. The pressure sensor 26 and the target sensor 27 are electrically connected with the control unit CO.

The laser apparatus LD includes a master oscillator as a light source configured to perform burst operation. The master oscillator emits the laser beam 301 in pulses in a burst-on duration. The master oscillator is, for example, a $CO_2$ laser apparatus configured to emit a laser beam having a wavelength of 10.6 μm by exciting, through electrical discharging, gas as mixture of carbon dioxide gas with helium, nitrogen, or the like. The master oscillator may emit the laser beam 301 in pulses by a Q switch scheme. The master oscillator may include a light switch, a polarizer, and the like. In the burst operation, the laser beam 301 is emitted in continuous pulses at a predetermined repetition frequency in a burst-on duration and the emission of the laser beam 301 is stopped in a burst-off duration.

The traveling direction of the laser beam 301 emitted from the laser apparatus LD is adjusted by the laser beam delivery optical system 30. The laser beam delivery optical system 30 includes a plurality of mirrors 30A and 30B for adjusting the traveling direction of the laser beam 301, and the position of at least one of the mirrors 30A and 30B is adjusted by an actuator (not illustrated). Through this adjustment of the position of at least one of the mirrors 30A and 30B, the laser beam 301 may propagate into the chamber device 10 through the window 12 appropriately.

The control unit CO may be, for example, a micro controller, an integrated circuit (IC), an integrated circuit such as a large-scale integrated circuit (LSI) or an application specific integrated circuit (ASIC), or a numerical control (NC) device. When the control unit CO is a NC device, the control unit CO may or may not include a machine learning device. The control unit CO controls the entire EUV light generation apparatus 100 and also controls the laser apparatus LD. The control unit CO receives, for example, a signal related to the pressure in the internal space of the chamber device 10, which is measured by the pressure sensor 26, a signal related to image data of the droplet DL captured by the target sensor 27, and a burst signal from the exposure apparatus 200. The control unit CO processes the image data and the like and controls the output timing of the droplet DL, the output direction of the droplet DL, and the like.

The chamber device 10 also includes a gas supply unit 16S configured to supply etching gas to the internal space of the chamber device 10. The gas supply unit 16S is connected with a gas supply tank 16 from which the etching gas is supplied through a pipe. As described above, since the target substance contains tin, the etching gas is, for example, hydrogen-containing gas having a hydrogen gas concentration of 100% in effect. Alternatively, the etching gas may be balance gas having a hydrogen gas concentration of 3% approximately. The balance gas may contain nitrogen ($N_2$) gas or argon (Ar) gas. The pipe between the gas supply unit 16S and the gas supply tank 16 may be provided with a supply gas flow amount adjustment unit (not illustrated).

The gas supply unit 16S has the shape of the side surface of a circular truncated cone and is called a cone in some cases. A gas supply inlet of the gas supply unit 16S is inserted into the through-hole 50H provided to the EUV light condensation mirror 50, and the gas supply unit 16S supplies the etching gas through the through-hole 50H in a direction departing from the EUV light condensation mirror 50. The laser beam 301 passes through the through-hole 50H of the EUV light condensation mirror 50 as described above through the gas supply unit 16S. Accordingly, the gas supply unit 16S has a configuration through which the laser beam 301 can transmit on the window 12 side.

Tin fine particles and tin charged particles are generated when plasma is generated from the target substance forming the droplet DL in the plasma generation region AR. The etching gas supplied from the gas supply unit 16S contains hydrogen that reacts with tin contained in these fine particles and charged particles. Through the reaction with hydrogen, tin becomes stannane ($SnH_4$) gas at room temperature.

The chamber device 10 further includes a pair of discharge ports 10E. The discharge ports 10E are provided, for example, at positions facing each other on the wall of the chamber device 10. The residual gas contains tin fine particles and charged particles generated through the plasma generation from the target substance, stannane generated through the reaction of the tin fine particles and charged particles with the etching gas, and unreacted etching gas. Some of the charged particles are neutralized in the chamber device 10, and the residual gas contains the neutralized charged particles as well. Each discharge port 10E through which the residual gas is discharged is connected with a discharge pipe, and the discharge pipe is connected with an exhaust device 17. Thus, the residual gas discharged through the discharge ports 10E flows into the exhaust device 17 through the discharge pipe.

3.2 Operation

In the EUV light generation apparatus 100, an atmosphere in the chamber device 10 is discharged, for example, at new installation or maintenance. In this process, purge and discharge may be repeated in the chamber device 10 to discharge components in the atmosphere. Purge gas is preferably inert gas such as nitrogen or argon. When the pressure in the chamber device 10 becomes equal to or smaller than a predetermined pressure after the atmosphere in the chamber device 10 is discharged, the control unit CO starts introduction of the etching gas from the gas supply unit 16S into the chamber device 10. In this case, the control unit CO may control a flow rate adjuster (not illustrated) disposed at the pipe between the gas supply unit 16S and the gas supply tank 16 while discharging gas in the internal space of the chamber device 10 to the exhaust device 17 through the discharge port 10E so that the pressure in the internal space of the chamber device 10 is maintained at the predetermined pressure. The control unit CO maintains the pressure in the internal space of the chamber device 10 substantially constant based on a signal related to the pressure in the internal space of the chamber device 10, which is measured by the pressure sensor 26.

The control unit CO supplies current from the heater power source 45 to the heater 44 to increase the temperature of the heater 44 so that the target substance in the tank 41 is heated to or maintained at a predetermined temperature equal to or higher than the melting point. Thereafter, the control unit CO controls the temperature of the target substance to the predetermined temperature by adjusting the amount of current supplied from the heater power source 45 to the heater 44 based on an output from a temperature sensor (not illustrated). The predetermined temperature is in a range of, for example, 250° C. to 290° C. when the target substance is tin.

The control unit CO controls the pressure adjuster 43 to adjust the pressure in the tank 41 so that the target substance being melted is output through a nozzle hole of the nozzle 42 at a predetermined speed. The target substance discharged through the hole of the nozzle 42 may be in the form of jet. In this case, the control unit CO generates the droplet DL by applying voltage having a predetermined waveform to the piezoelectric element 46 through the piezoelectric power source 47. Vibration of the piezoelectric element 46 can propagate through the nozzle 42 to a jet of the target substance output from the hole of the nozzle 42. The jet of the target substance is divided in a predetermined period by the vibration, and accordingly, the droplet DL is generated from the target substance.

The control unit CO outputs a light emission trigger to the laser apparatus LD. Having received the light emission trigger, the laser apparatus LD emits the laser beam 301 having a wavelength of, for example, 10.6 μm in pulses. The emitted laser beam 301 is incident on the laser condensation optical system 13 through the laser beam delivery optical system 30 and the window 12. In this case, the control unit CO controls the laser beam manipulator 13C of the laser condensation optical system 13 so that the laser beam 301 condenses in the plasma generation region AR. In addition, the control unit CO controls the laser apparatus LD to emit the laser beam 301 based on a signal from the target sensor 27 so that the droplet DL is irradiated with the laser beam 301. Accordingly, the droplet DL is irradiated in the plasma generation region AR with the laser beam 301 converged by the laser beam condensation mirror 13A. Plasma generated through the irradiation radiates light including EUV light having a wavelength of, for example, 13.5 nm.

Among the light including EUV light generated in the plasma generation region AR, the EUV light 101 is reflected and condensed to the intermediate focus point IF by the EUV light condensation mirror 50 and then incident on the exposure apparatus 200.

When plasma is generated from the target substance, charged fine particles and electrically neutral fine particles are generated as described above. Some of the fine particles flow into the discharge ports 10E. For example, a magnetic field generation unit (not illustrated) or the like may be provided to generate a magnetic field for converging charged fine particles generated in the plasma generation region AR to the discharge ports 10E. In this case, each charged fine particle receives Lorentz force from the magnetic field and is induced to the discharge ports 10E while converging on a helical trajectory along a magnetic field line, and a large number of charged fine particles flow into the discharge ports 10E. Some other of the fine particles diffusing in the chamber device 10 adhere to a reflective surface of the EUV light condensation mirror 50. Some of the fine particles adhering to the reflective surface become predetermined product material through reaction with the etching gas supplied from the gas supply unit 16S. When the target substance is tin and the etching gas contains hydrogen as described above, the product material is stannane gas at room temperature. The product material obtained through reaction with the etching gas flows into the discharge ports 10E on flow of unreacted etching gas. The fine particles and residual gas having flowed into the discharge ports 10E are provided with predetermined discharge treatment such as detoxification at the exhaust device 17.

4. Description of EUV Light Condensation Mirror of Comparative Example

The following describes the EUV light condensation mirror 50 of a comparative example in an extreme ultraviolet light generation apparatus 100 described above. Any component same as that described above is denoted by an identical reference sign, and duplicate description thereof is omitted unless specific description is needed.

4.1 Configuration

Figure 3:
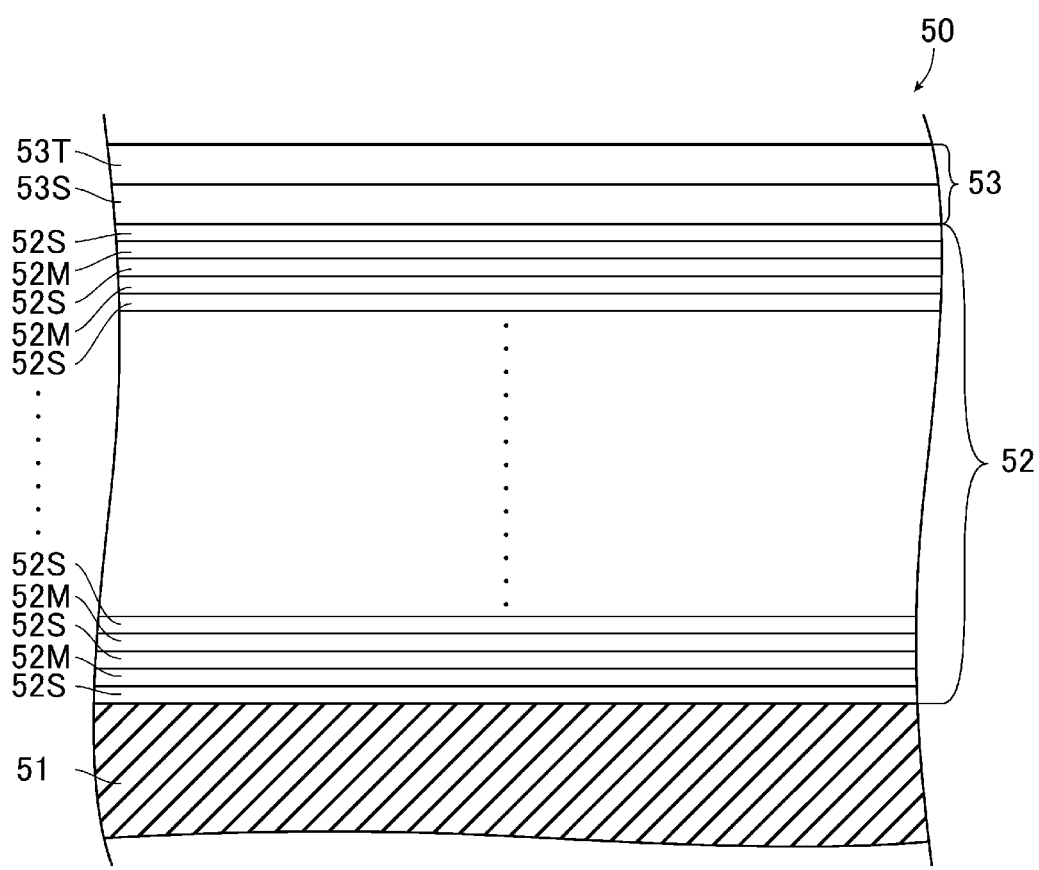
FIG. 3 is a cross-sectional view of an extreme ultraviolet light condensation mirror in a comparative example.

FIG. 3 is a cross-sectional view of the EUV light condensation mirror 50 in the comparative example. As illustrated in FIG. 3, the EUV light condensation mirror 50 includes a substrate 51, a multi-layer reflective film 52, and a protective film 53.

The substrate 51 has a shape substantially same as that of the EUV light condensation mirror 50 illustrated in FIG. 2, and one surface thereof on the reflective surface side is recessed in a substantially spheroid shape. The one surface has an elliptical surface shape conjugate to the plasma generation region AR as the first focal point and to the intermediate focus point IF as the second focal point at a position different from the first focal point.

The multi-layer reflective film 52 is provided on the one surface of the substrate 51. The multi-layer reflective film 52 is formed by alternately stacking an amorphous silicon layer 52S and molybdenum layer 52M. A layer on the most surface side in the multi-layer reflective film 52 is the amorphous silicon layer 52S. The total number of multi-layer reflective films 52 is preferably, for example, 50 to 100 inclusive. For the EUV light 101 having a wavelength of 13.5 nm, the refractive index of the amorphous silicon layer 52S is 0.99 and the refractive index of the molybdenum layer 52M is 0.92. When the EUV light 101 has a wavelength of 13.5 nm, the thickness of the amorphous silicon layer 52S is 4 nm approximately and the thickness of the molybdenum layer 52M is 3 nm approximately. The multi-layer reflective film 52 may have another configuration as long as the multi-layer reflective film 52 is formed by alternately stacking the amorphous silicon layer 52S and a layer having a refractive index different from that of the amorphous silicon layer 52S and reflects the EUV light 101. Thus, for example, a ruthenium layer, a rhodium layer, or a palladium layer may be used in place of the molybdenum layer 52M.

The protective film 53 is provided on the multi-layer reflective film 52. The protective film 53 is a film that transmits the EUV light 101. The protective film 53 contacts the amorphous silicon layer 52S as the layer on the most surface side in the multi-layer reflective film 52. The protective film 53 of the present example includes an oxide silicon layer 53S and a titanium oxide layer 53T. The oxide silicon layer 53S is provided on the multi-layer reflective film 52, and the titanium oxide layer 53T is provided on the oxide silicon layer 53S and exposed to the internal space of the chamber device 10. The protective film 53 is not limited to the above-described example as long as the protective film 53 is a film that transmits the EUV light 101. For example, a zirconium oxide layer, a ruthenium oxide layer, a molybdenum oxide layer, or a titanium oxynitride layer may be used in place of the titanium oxide layer 53T of the protective film 53, and a zirconium nitride layer, a silicon nitride layer, a silicon oxynitride layer, or a zirconium oxynitride layer may be used in place of the oxide silicon layer 53S.

4.2 Problem

As the extreme ultraviolet light generation device 100 is used, a blister occurs between the multi-layer reflective film 52 and the protective film 53 of the EUV light condensation mirror 50 in some cases. A main component of the blister is hydrogen. The present inventor thinks that the blister occurs as follows. When light is radiated from the droplet DL as the extreme ultraviolet light generation device 100 is used, a hydrogen atom in the etching gas may become a hydrogen radical by the light or a secondary electron discharged through irradiation with the light. The hydrogen radical passes through the protective film 53 and reaches the multi-layer reflective film 52 in some cases. A silicon atom in the amorphous silicon layer 52S has a dangling bond. When bonded with a hydrogen radical, this dangling bond is terminated with the hydrogen atom. The binding energy of Si—H is 3.1 eV approximately, which is not much large. However, the binding energy of H—H in a hydrogen molecule is 4.5 eV approximately. Thus, a hydrogen molecule can be formed when the hydrogen atom bonded with the silicon atom reacts with another hydrogen radical. In this case, the silicon atom unbonded with the hydrogen atom has a dangling bond again. As this reaction is repeated, a large number of hydrogen molecules are generated. Each generated hydrogen molecule has a size larger than that of a hydrogen radical and thus is unlikely to pass through the protective film 53. Accordingly, hydrogen molecules accumulate between the multi-layer reflective film 52 and the protective film 53 and become a blister. The blister generated in the EUV light condensation mirror 50 can decrease the reflectance of the EUV light condensation mirror 50 for EUV light.

The following embodiments each exemplarily describe an EUV light condensation mirror, decrease of the reflectance of which can be reduced.

5. Description of EUV Light Condensation Mirror of Embodiment 1

The following describes the configuration of the EUV light condensation mirror 50 of Embodiment 1. Any component same as that described above is denoted by an identical reference sign, and duplicate description thereof is omitted unless specific description is needed.

5.1 Configuration

Figure 4:
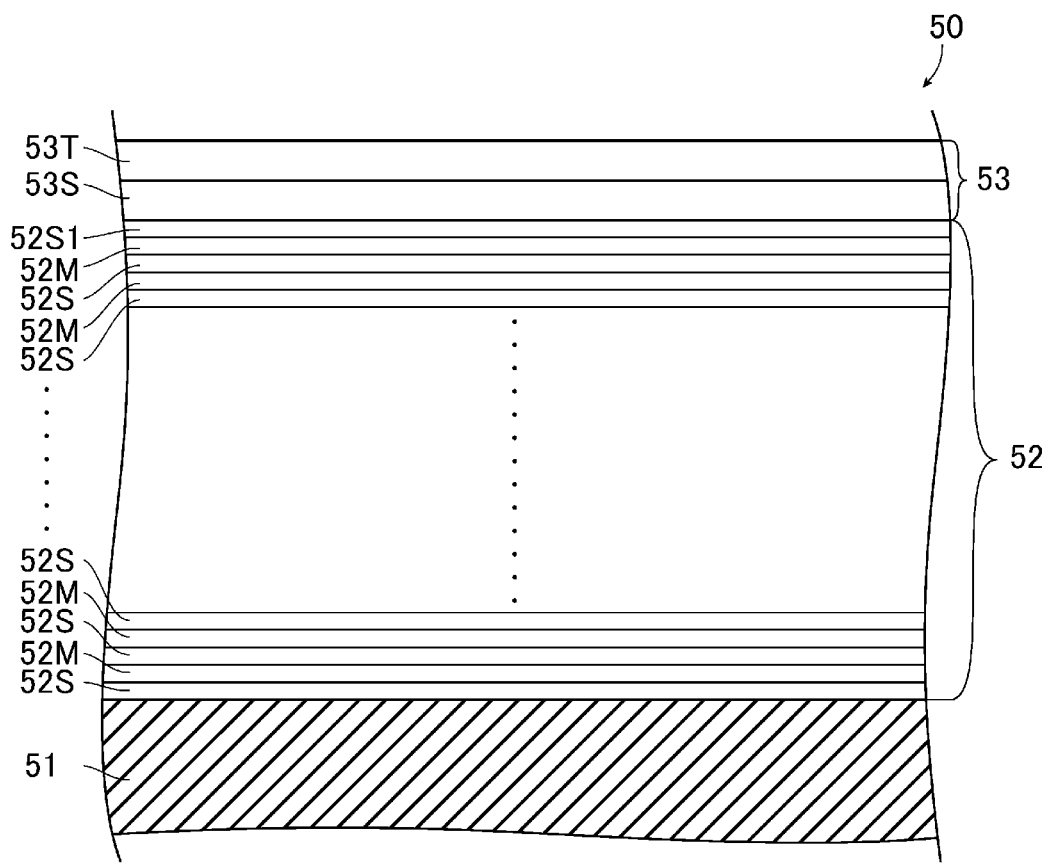
FIG. 4 is a cross-sectional view of the extreme ultraviolet light condensation mirror in Embodiment 1.

FIG. 4 is a cross-sectional view of the EUV light condensation mirror 50 in the present embodiment. In the EUV light condensation mirror 50 according to the present embodiment, an amorphous silicon layer 52S1 as a layer on the most surface side in the multi-layer reflective film 52 is different from the amorphous silicon layer 52S as a layer on the most surface side in the multi-layer reflective film 52 of the comparative example. The amorphous silicon layer 52S1 according to the present embodiment contains a silicon atom bonded with a cyano radical.

Figure 5:
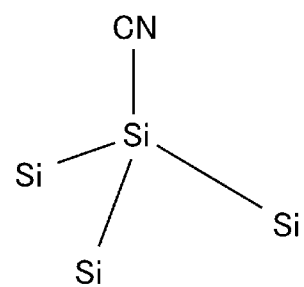
FIG. 5 is a diagram schematically illustrating the status of a silicon atom bonded with a cyano radical.

FIG. 5 is a diagram schematically illustrating the status of a silicon atom bonded with a cyano radical. As illustrated in FIG. 5, a dangling bond of the silicon atom is terminated with the cyano radical when the silicon atom is bonded with the cyano radical. The binding energy of Si—CN is 4.5 eV approximately.

5.2 Manufacturing Method

The following describes methods of manufacturing the EUV light condensation mirror 50 according to the present embodiment.

<First Manufacturing Method>

Figure 6:
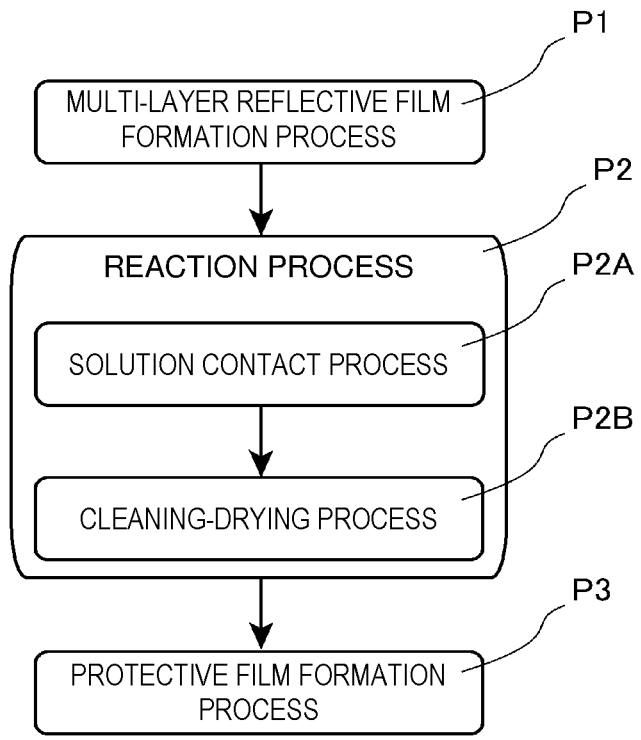
FIG. 6 is a flowchart illustrating the process of a first method of manufacturing the extreme ultraviolet light condensation mirror of Embodiment 1.

The following first describes a first method of manufacturing the EUV light condensation mirror 50 according to the present embodiment. FIG. 6 is a flowchart illustrating the process of the first method of manufacturing the EUV light condensation mirror 50 according to the present embodiment. As illustrated in FIG. 6, the present manufacturing method includes a multi-layer reflective film formation process P1, a reaction process P2, and a protective film formation process P3.

<Multi-Layer Reflective Film Formation Process P1>

In the present process, the multi-layer reflective film 52 is formed on one surface of the substrate 51. In the present process, for example, the amorphous silicon layers 52S and the molybdenum layer 52M are alternately stacked, and the amorphous silicon layer 52S1 as the layer on the most surface side is stacked last. The molybdenum layer 52M can be stacked by any method such as a sputtering method, a vacuum evaporation method, a chemical vapor deposition method, or an atomic layer deposition method. The amorphous silicon layers 52S and 52S1 can be stacked by any method such as the sputtering method, the vacuum evaporation method, the chemical vapor deposition method, or the atomic layer deposition method. Similarly to the other amorphous silicon layers 52S, the amorphous silicon layer 52S1 as the most surface-side layer formed at the end of the present process does not contain a cyano radical.

<Reaction Process P2>

In the present process, each of at least some silicon atoms in the amorphous silicon layer 52S1 of the multi-layer reflective film 52 formed in the multi-layer reflective film formation process P1 is bonded with a cyano radical. The present process includes a solution contact process P2A and a cleaning-drying process P2B.

<Solution Contact Process P2A>

Figure 7:
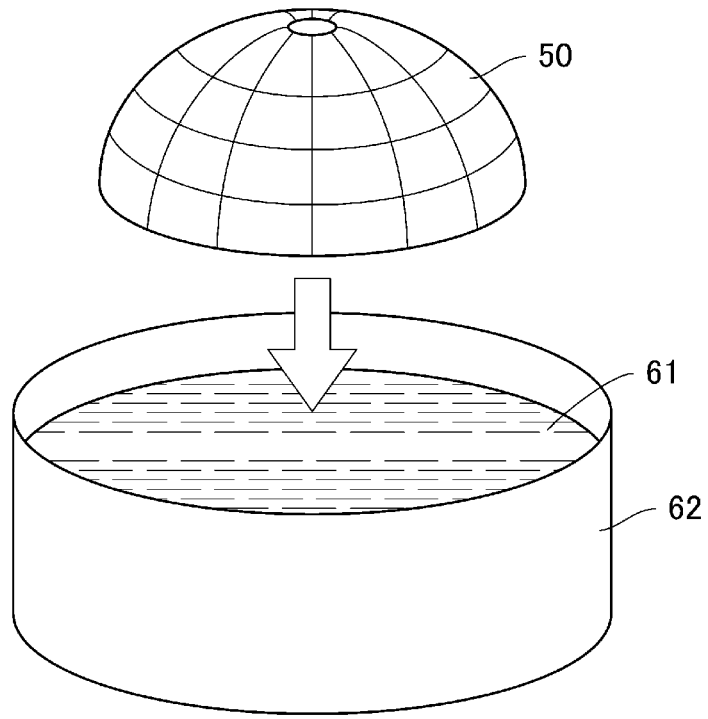
FIG. 7 is a diagram illustrating a first exemplary solution contact process.
Figure 8:
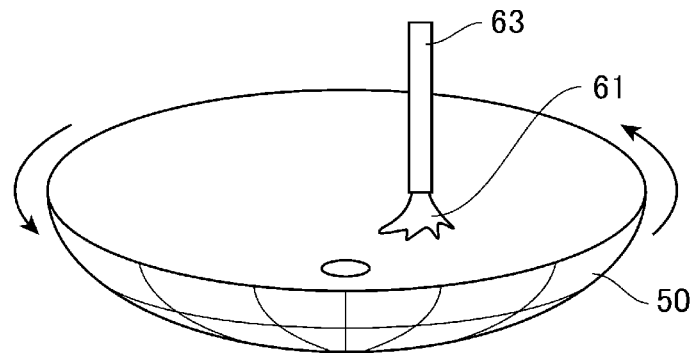
FIG. 8 is a diagram illustrating a second exemplary solution contact process.

In the present process, the amorphous silicon layer 52S1 of the multi-layer reflective film 52 is made contact with a solution 61 containing cyanide ions ($CN^-$). FIG. 7 is a diagram illustrating a first example of the present process. As illustrated in FIG. 7, in the present example, the EUV light condensation mirror 50 in which the multi-layer reflective film 52 is formed on the substrate 51 but the protective film 53 is not formed is immersed in a drug solution tank 62 filled with the solution 61. Accordingly, the amorphous silicon layer 52S1 contacts the solution 61. FIG. 8 is a diagram illustrating a second example of the present process. As illustrated in FIG. 8, in the present example, the EUV light condensation mirror 50 in which the multi-layer reflective film 52 is formed on the substrate 51 but the protective film 53 is not formed is rotated at a high speed, and the solution 61 is dropped onto the multi-layer reflective film 52 from a nozzle 63. Accordingly, the multi-layer reflective film 52 is spin-coated with the solution 61, and the amorphous silicon layer 52S1 contacts the solution 61. The solution 61 is preferably dropped onto the multi-layer reflective film 52 while the nozzle 63 is moved in the radial direction of the EUV light condensation mirror 50.

The solution 61 containing cyanide ions and used in the present process may be, for example, a potassium cyanide (KCN) solution or a hydrogen cyanide (HCN) solution. The potassium cyanide solution may be, for example, a potassium cyanide aqueous solution. The hydrogen cyanide solution may be, for example, cyanhydric acid. The potassium cyanide solution preferably contains crown ether to prevent potassium contamination of amorphous silicon.

When the solution 61 and the amorphous silicon layer 52S1 contact each other, a silicon atom in the amorphous silicon layer 52S1 reacts with a cyanide ion in the solution 61 and is bonded with a cyano radical. Accordingly, a dangling bond of the silicon atom is terminated.

<Cleaning-Drying Process P2B>

In the present process, unnecessary solution 61 adhering to the EUV light condensation mirror 50 in the solution contact process P2A is cleaned with cleaning liquid, and the cleaning liquid is dried. In the cleaning, for example, the solution 61 is washed away with cleaning liquid such as ultrapure water. Thereafter, the cleaning liquid adhering to the EUV light condensation mirror 50 is removed by drying.

<Protective Film Formation Process P3>

In the present process, the protective film 53 is formed on the multi-layer reflective film 52. When the protective film 53 includes the oxide silicon layer 53S and the titanium oxide layer 53T as described above, the oxide silicon layer 53S is stacked on the multi-layer reflective film 52. The oxide silicon layer 53S can be stacked by any method such as the sputtering method, the vacuum evaporation method, the chemical vapor deposition method, or the atomic layer deposition method. Subsequently, the titanium oxide layer 53T is stacked on the oxide silicon layer 53S. The titanium oxide layer 53T can be stacked by any method such as the sputtering method, the vacuum evaporation method, the chemical vapor deposition method, or the atomic layer deposition method.

Accordingly, the EUV light condensation mirror 50 illustrated in FIG. 4 is manufactured.

<Second Manufacturing Method>

Figure 9:
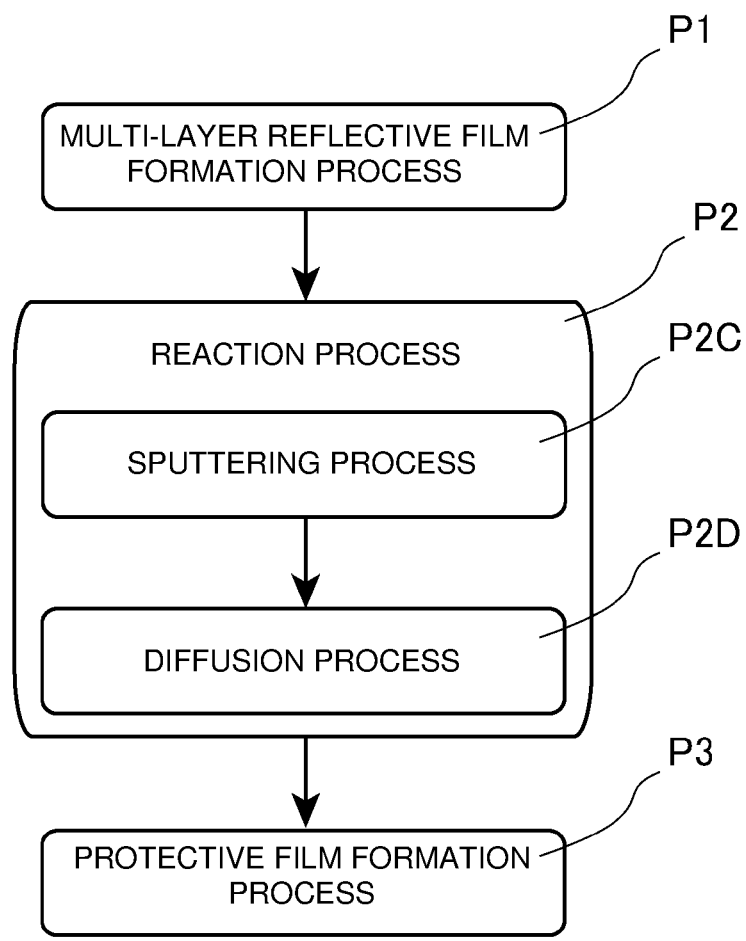
FIG. 9 is a flowchart illustrating the process of a second method of manufacturing the extreme ultraviolet light condensation mirror of Embodiment 1.

The following describes a second method of manufacturing the EUV light condensation mirror 50 according to the present embodiment. Any component same as that described above is denoted by an identical reference sign, and duplicate description thereof is omitted unless specific description is needed. FIG. 9 is a flowchart illustrating the process of the second method of manufacturing the EUV light condensation mirror 50 according to the present embodiment. As illustrated in FIG. 9, the present manufacturing method includes the multi-layer reflective film formation process P1, the reaction process P2, and the protective film formation process P3. The present manufacturing method is different from the first manufacturing method in that the reaction process P2 includes a sputtering process P2C and a diffusion process P2D.

<Sputtering Process P2C>

Figure 10:
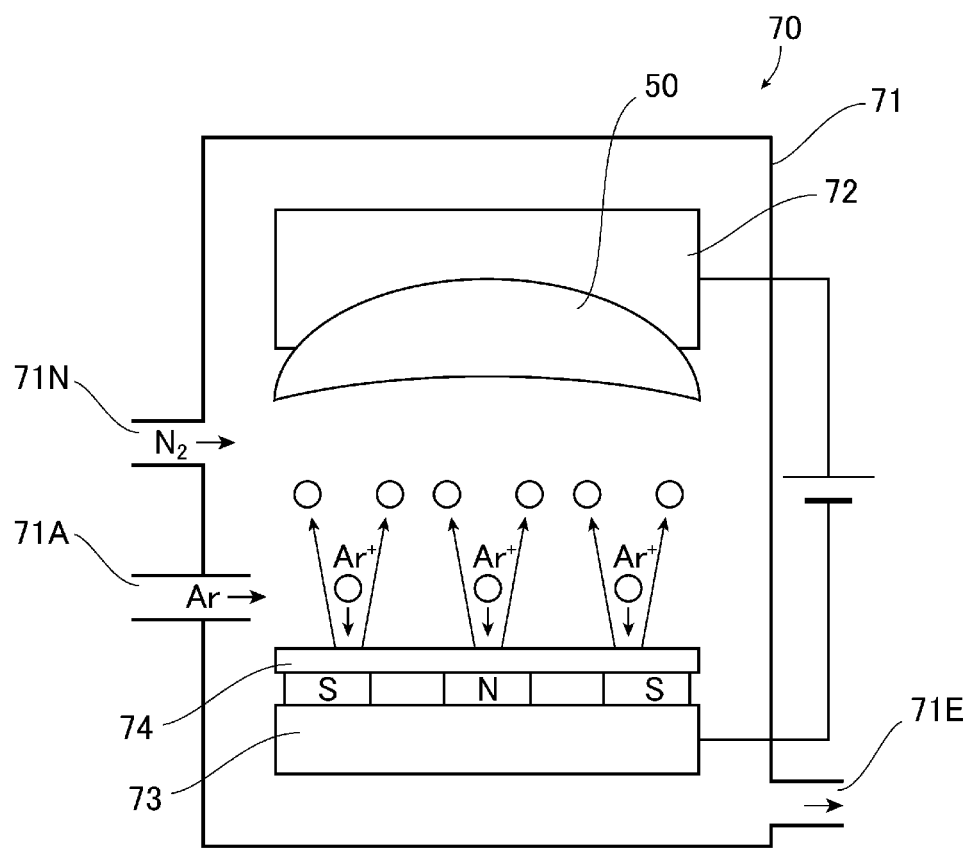
FIG. 10 is a diagram illustrating the status of a first exemplary sputtering process.

FIG. 10 is a diagram illustrating the status of a first example of the present process. As illustrated in FIG. 10, a magnetron sputtering device is used as a sputtering device 70 in the present process. The sputtering device 70 includes a chamber 71, a holder 72, and a magnet 73, which are disposed in the chamber 71. An introduction port 71N through which nitrogen gas is introduced is provided on the holder 72 side in the chamber 71, and an introduction port 71A through which argon gas is introduced is provided on the magnet 73 side in the chamber 71. In addition, the chamber 71 is provided with a discharge port 71E for discharging gas. Voltage is applied to the holder 72 and the magnet 73 so that the holder 72 serves as an anode and the magnet 73 serves as a cathode. A sputtering target 74 is disposed on the magnet 73. The EUV light condensation mirror 50 is disposed on the holder 72 such that the multi-layer reflective film 52 faces the sputtering target 74. The sputtering target 74 is made of a material containing carbon such as graphite.

In the present process, the sputtering target 74 containing carbon is sputtered in an atmosphere containing argon and nitrogen so that carbon and nitrogen contact the amorphous silicon layer 52S1 of the multi-layer reflective film 52. In the present process, argon ions are made to collide with the sputtering target 74 to scatter carbon from the sputtering target 74. Then, the scattered carbon is made to reach the multi-layer reflective film 52 while reacting with nitrogen, and as a result, cyanide ions and cyan radicals contact the amorphous silicon layer 52S1 of the multi-layer reflective film 52. The binding energy of C—N is 7.8 eV approximately and higher than the binding energy of Si—C (4.7 eV) and the binding energy of Si—N (4.9 eV), and thus the C—N bond is maintained when the cyanide ion and the cyan radical contact the amorphous silicon layer 52S1.

Figure 11:
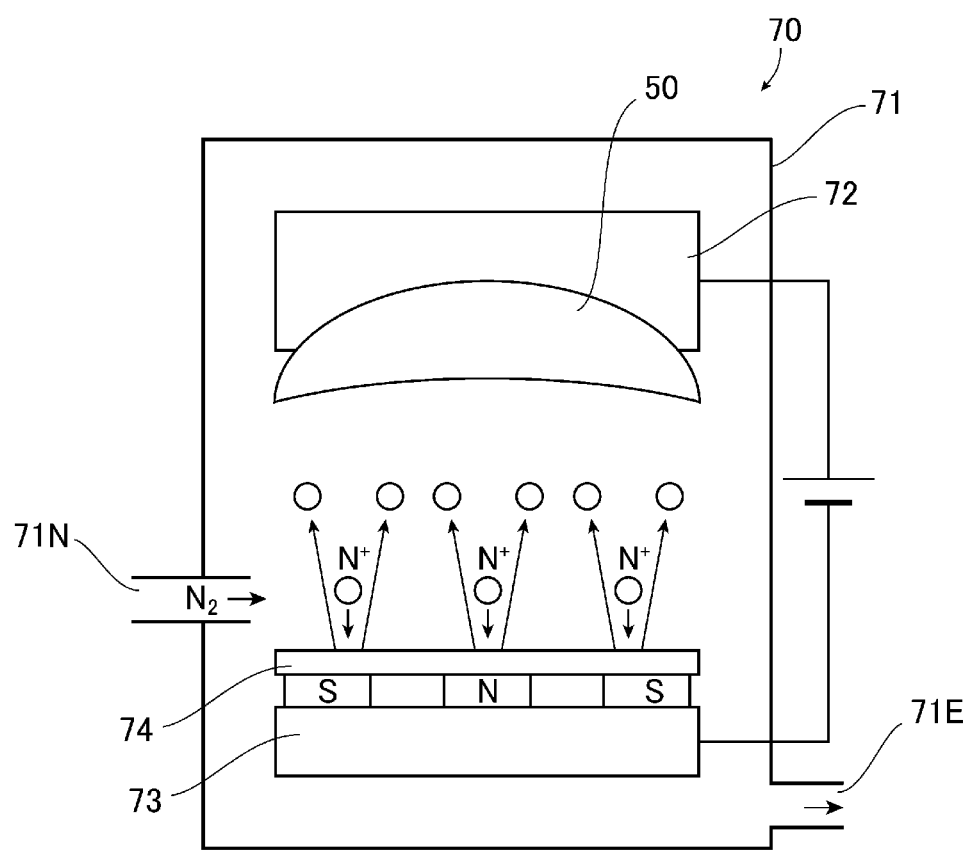
FIG. 11 is a diagram illustrating the status of a second exemplary sputtering process.

FIG. 11 is a diagram illustrating the status of a second example of the present process. As illustrated in FIG. 11, the sputtering device 70 of the present example is different from the sputtering device 70 of the first example in that the introduction port 71N through which nitrogen gas is introduced is provided on the magnet 73 side in the chamber 71 but no introduction port through which argon gas is introduced is provided. In the present example, nitrogen ions are made to collide with the sputtering target 74 to scatter carbon from the sputtering target 74. The sputtering rate is lower for carbon sputtering by nitrogen ions than for carbon sputtering by argon ions, but the ratio of the amount of cyanide ions and cyan radicals reaching the multi-layer reflective film 52 relative to the amount of carbon reaching the multi-layer reflective film 52 is larger.

<Diffusion Process P2D>

In the present process, carbon, nitrogen ions, and cyanide ions having reached the amorphous silicon layer 52S1 are diffused in the amorphous silicon layer 52S1. The present process is performed by heating the EUV light condensation mirror 50. In the present process, the EUV light condensation mirror 50 is heated to, for example, 10° C. to 200° C. inclusive. In the present process, a cyanide ion is further generated through reaction between a carbon atom and a nitrogen ion and then reacts with a silicon atom in the amorphous silicon layer 52S1, and accordingly, the silicon atom is bonded with a cyano radical.

The present process may be performed simultaneously with the sputtering process P2C. In this case, the sputtering process P2C is performed while the EUV light condensation mirror 50 is heated.

Accordingly, the EUV light condensation mirror 50 illustrated in FIG. 4 is manufactured.

5.3 Effect

As described above, the most surface-side layer of the multi-layer reflective film 52 in the EUV light condensation mirror 50 according to the present embodiment is the amorphous silicon layer 52S1 containing a silicon atom bonded with a cyano radical. The binding energy of Si—CN is 4.5 eV approximately and the binding energy of Si—H is 3.1 eV approximately as described above. Thus, the cyano radical is prevented from being replaced with a hydrogen radical having reached the amorphous silicon layer 52S1 through the protective film 53 when the hydrogen radical contacts the silicon atom bonded with the cyano radical. Thus, at least some of hydrogen radicals having reached the amorphous silicon layer 52S1 are discharged out of the EUV light condensation mirror 50 through the protective film 53 again. Accordingly, in the EUV light condensation mirror 50 according to the present embodiment, blister generation can be prevented and reflectance decrease can be reduced.

6. Description of EUV Light Condensation Mirror of Embodiment 2

The following describes the configuration of an EUV light condensation mirror 50 of Embodiment 2. Any component same as that described above is denoted by an identical reference sign, and duplicate description thereof is omitted unless specific description is needed.

6.1 Configuration

Figure 12:
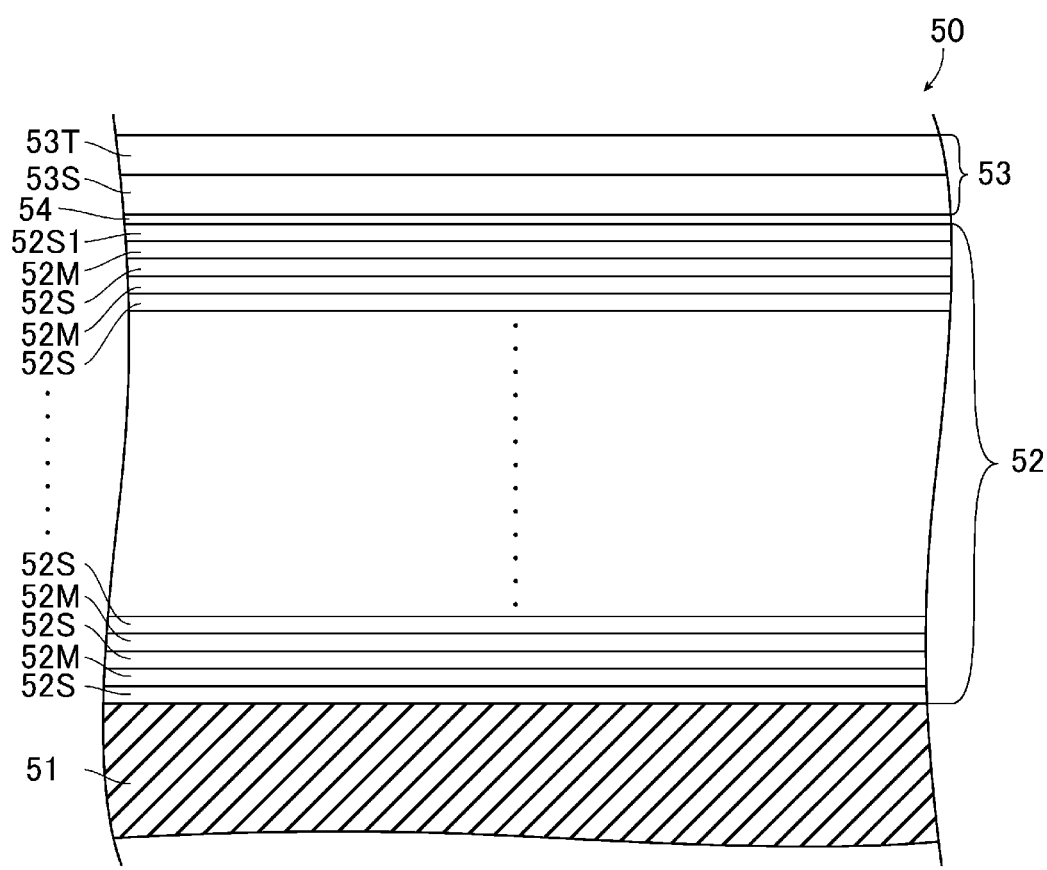
FIG. 12 is a cross-sectional view of the extreme ultraviolet light condensation mirror of Embodiment 2.

FIG. 12 is a cross-sectional view of the EUV light condensation mirror 50 in the present embodiment. As illustrated in FIG. 12, the EUV light condensation mirror 50 according to the present embodiment is different from the EUV light condensation mirror 50 of Embodiment 1 in that a CN layer 54 is provided between the multi-layer reflective film 52 and the protective film 53.

In the present embodiment, some cyano radicals in the CN layer 54 are each bonded with one of some silicon atoms in the amorphous silicon layer 52S1 to terminate a dangling bond of the silicon atom. The CN layer 54 is preferably amorphous. In this case, the thickness of the CN layer 54 is, for example, 0.1 nm to 1 nm inclusive to maintain flatness of the amorphous silicon layer 52S1.

The EUV light condensation mirror 50 according to the present embodiment may be manufactured by a manufacturing method same as the second manufacturing method of Embodiment 1. However, the sputtering process P2C may be performed for a longer time than the sputtering process P2C in the second manufacturing method of Embodiment 1. Accordingly, the CN layer 54 is formed.

6.2 Effect

In the EUV light condensation mirror 50 according to the present embodiment, dangling bonds in the amorphous silicon layer 52S1 can be efficiently terminated with CN radicals since the entire region of an interface of the amorphous silicon layer 52S1 on the protective film 53 side is covered by the CN layer 54.

7. Description of EUV Light Condensation Mirror 50 of Embodiment 3

The following describes the configuration of an EUV light condensation mirror of Embodiment 3. Any component same as that described above is denoted by an identical reference sign, and duplicate description thereof is omitted unless specific description is needed.

7.1 Configuration

Figure 13:
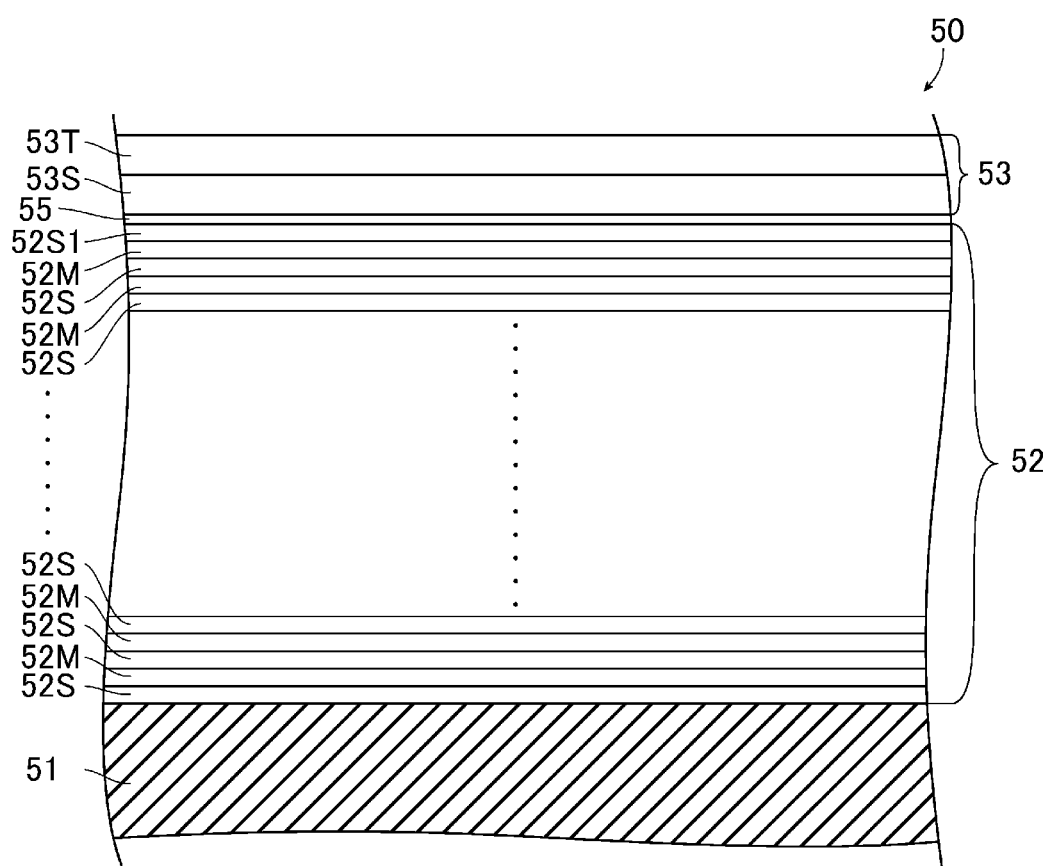
FIG. 13 is a cross-sectional view of the extreme ultraviolet light condensation mirror of Embodiment 3.

FIG. 13 is a cross-sectional view of the EUV light condensation mirror 50 in the present embodiment. As illustrated in FIG. 13, the EUV light condensation mirror 50 according to the present embodiment is different from the EUV light condensation mirror 50 of Embodiment 1 in that a SiCN layer 55 is provided between the multi-layer reflective film 52 and the protective film 53.

In the present embodiment, some cyano radicals in the SiCN layer 55 are each bonded with one of some silicon atoms in the amorphous silicon layer 52S1 to terminate a dangling bond of the silicon atom. The SiCN layer 55 is preferably amorphous. In this case, the thickness of the SiCN layer 55 is preferably, for example, 0.1 nm to 1 nm inclusive to maintain flatness of the amorphous silicon layer 52S1.

The EUV light condensation mirror 50 according to the present embodiment may be manufactured by the second manufacturing method of Embodiment 1. However, the sputtering target 74 containing carbon and silicon may be used in the sputtering process P2C. Examples of such a sputtering target 74 include a sputtering target made of a SiC substrate. Accordingly, the SiCN layer 55 is formed.

7.2 Effect

In the EUV light condensation mirror 50 according to the present embodiment, dangling bonds of the amorphous silicon layer 52S1 can be efficiently terminated with CN radicals since the entire region of the interface of the amorphous silicon layer 52S1 on the protective film 53 side is covered by the SiCN layer 55, and close contact between the amorphous silicon layer 52S1 and the SiCN layer 55 can be improved since the amorphous silicon layer 52S1 and the SiCN layer 55 both contain silicon.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more". Further, "at least one of A, B, and C" should be interpreted to mean any of A, B, C, A+B, A+C, B+C, and A+B+C as well as to include combinations of the any thereof and any other than A, B, and C.

What is claimed is:

1. An extreme ultraviolet light condensation mirror comprising:
    a substrate; and
    a multi-layer reflective film provided on the substrate, formed by alternately stacking an amorphous silicon layer and a layer having a refractive index different from a refractive index of the amorphous silicon layer, and configured to reflect extreme ultraviolet light,
    a layer on a most surface side in the multi-layer reflective film being the amorphous silicon layer containing a silicon atom bonded with a cyano radical.

2. The extreme ultraviolet light condensation mirror according to claim 1, wherein a protective film that transmits the extreme ultraviolet light is provided on the multi-layer reflective film.

3. The extreme ultraviolet light condensation mirror according to claim 2, wherein a CN layer is provided between the multi-layer reflective film and the protective film.

4. The extreme ultraviolet light condensation mirror according to claim 2, wherein a SiCN layer is provided between the multi-layer reflective film and the protective film.

5. An extreme ultraviolet light condensation mirror manufacturing method comprising:
    a multi-layer reflective film formation process of forming, on a substrate, a multi-layer reflective film configured to reflect extreme ultraviolet light by alternately stacking an amorphous silicon layer and a layer having a refractive index different from a refractive index of the amorphous silicon layer so that a layer on a most surface side is the amorphous silicon layer; and a reaction process of bonding, with a cyano radical, each of at least some silicon atoms in the amorphous silicon layer on the most surface side in the multi-layer reflective film.

6. The extreme ultraviolet light condensation mirror manufacturing method according to claim 5, wherein, in the reaction process, the amorphous silicon layer on the most surface side in the multi-layer reflective film is made contact with a solution containing cyanide ions.

7. The extreme ultraviolet light condensation mirror manufacturing method according to claim 6, wherein the solution is a potassium cyanide solution.

8. The extreme ultraviolet light condensation mirror manufacturing method according to claim 6, wherein the solution is cyanhydric acid.

9. The extreme ultraviolet light condensation mirror manufacturing method according to claim 7, wherein the solution contains crown ether.

10. The extreme ultraviolet light condensation mirror manufacturing method according to claim 5, wherein, in the reaction process, a sputtering target containing carbon is sputtered by nitrogen ions so that carbon and nitrogen are made contact with the amorphous silicon layer on the most surface side in the multi-layer reflective film.

11. The extreme ultraviolet light condensation mirror manufacturing method according to claim 10, wherein, a CN layer is stacked on the amorphous silicon layer on the most surface side in the multi-layer reflective film.

12. The extreme ultraviolet light condensation mirror manufacturing method according to claim 10, wherein
the sputtering target contains silicon, and
a SiCN layer is stacked on the amorphous silicon layer on the most surface side in the multi-layer reflective film.

13. The extreme ultraviolet light condensation mirror manufacturing method according to claim 5, wherein, in the reaction process, a sputtering target containing carbon is sputtered in an atmosphere containing argon and nitrogen so that carbon and nitrogen are made contact with the amorphous silicon layer on the most surface side in the multi-layer reflective film.

14. The extreme ultraviolet light condensation mirror manufacturing method according to claim 13, wherein a CN layer is stacked on the amorphous silicon layer on the most surface side in the multi-layer reflective film.

15. The extreme ultraviolet light condensation mirror manufacturing method according to claim 13, wherein
the sputtering target contains silicon, and
a SiCN layer is stacked on the amorphous silicon layer on the most surface side in the multi-layer reflective film.

16. An electronic device manufacturing method comprising:
generating extreme ultraviolet light with an extreme ultraviolet light generation device including
a chamber having an internal space in which a laser beam is condensed and plasma is generated from a target substance at a condensed position of the laser beam, and
an extreme ultraviolet light condensation mirror configured to condense extreme ultraviolet light radiated through the plasma generation from the target substance,
the extreme ultraviolet light condensation mirror including
a substrate, and
a multi-layer reflective film provided on the substrate, formed by alternately stacking an amorphous silicon layer and a layer having a refractive index different from a refractive index of the amorphous silicon layer, and configured to reflect extreme ultraviolet light,
a layer on a most surface side in the multi-layer reflective film being the amorphous silicon layer containing a silicon atom bonded with a cyano radical;
outputting the extreme ultraviolet light to an exposure apparatus; and
exposing a photosensitive substrate to the extreme ultraviolet light in the exposure apparatus to manufacture an electronic device.

* * * * *